United States Patent
Plumhoff et al.

(10) Patent No.: US 8,187,483 B2
(45) Date of Patent: May 29, 2012

(54) METHOD TO MINIMIZE CD ETCH BIAS

(76) Inventors: Jason Plumhoff, Largo, FL (US); Sunil Srinivasan, Tampa, FL (US); David Johnson, Palm Harbor, FL (US); Russell Westerman, Largo, FL (US)

( * ) Notice: Subject to any disclaimer, the term of this patent is extended or adjusted under 35 U.S.C. 154(b) by 996 days.

(21) Appl. No.: 11/834,299

(22) Filed: Aug. 6, 2007

(65) Prior Publication Data
US 2008/0035606 A1    Feb. 14, 2008

Related U.S. Application Data

(60) Provisional application No. 60/837,593, filed on Aug. 11, 2006.

(51) Int. Cl.
*G01L 21/00* (2006.01)
*H01L 21/00* (2006.01)
(52) U.S. Cl. ............ 216/59; 216/67; 438/689; 438/710; 430/313
(58) Field of Classification Search .................. 438/689, 438/710; 216/59, 67
See application file for complete search history.

(56) References Cited

U.S. PATENT DOCUMENTS

| | | | |
|---|---|---|---|
| 4,707,218 A | 11/1987 | Giammarco et al. | |
| 4,985,114 A | 1/1991 | Okudaira et al. | |
| 5,501,893 A | 3/1996 | Laermer et al. | |
| 5,895,740 A | 4/1999 | Chien et al. | |
| 5,933,759 A | 8/1999 | Nguyen et al. | |
| 6,103,596 A | 8/2000 | Peng | |
| 6,436,763 B1 * | 8/2002 | Huang et al. | 438/255 |
| 6,458,706 B1 * | 10/2002 | Chiang et al. | 438/694 |
| 6,531,068 B2 | 3/2003 | Laermer et al. | |
| 6,583,065 B1 | 6/2003 | Williams et al. | |
| 6,660,646 B1 | 12/2003 | Elmadjiian | |
| 6,699,992 B2 | 3/2004 | Wang et al. | |
| 6,806,038 B2 | 10/2004 | Gu et al. | |
| 2003/0003374 A1 | 1/2003 | Buie et al. | |
| 2003/0235995 A1 | 12/2003 | Oluseyi et al. | |
| 2004/0033697 A1 | 2/2004 | Kumar et al. | |
| 2005/0032250 A1 * | 2/2005 | Mui et al. | 438/14 |
| 2005/0153538 A1 * | 7/2005 | Tsai et al. | 438/636 |
| 2005/0287815 A1 | 12/2005 | Lai et al. | |
| 2006/0046496 A1 | 3/2006 | Mui et al. | |
| 2006/0063077 A1 * | 3/2006 | Hata et al. | 430/5 |
| 2006/0166106 A1 * | 7/2006 | Chandrachood et al. | 430/5 |
| 2006/0166108 A1 | 7/2006 | Chandrachood et al. | |

FOREIGN PATENT DOCUMENTS

| | | |
|---|---|---|
| EP | 0562848 A2 | 9/1993 |
| JP | 04 291345 A | 10/1992 |
| WO | WO 9177725 | 5/1997 |
| WO | WO 0005749 A2 | 2/2000 |
| WO | WO 03060975 A1 | 7/2003 |
| WO | WO 2006012297 | 2/2006 |

* cited by examiner

*Primary Examiner* — Shamim Ahmed
(74) *Attorney, Agent, or Firm* — Harvey S. Kauget; Phelps Dunbar LLP

(57) ABSTRACT

The present invention provides a method for improving the critical dimension performance during a plasma etching process of a photolithographic substrate having a thin film. A passivation film is deposited onto the photolithographic substrate using a first set of process conditions. The deposited film is etched from the photolithographic substrate using a second set of process conditions. An exposed surface of the photolithographic substrate is etched using a third set of process conditions. During the plasma processing of the photolithographic substrate, the critical dimension performance of the photolithographic substrate is monitored to insure that the target uniformity and feature widths are obtained by adjusting the deposition and etch plasma processing of the photolithographic substrate.

16 Claims, 10 Drawing Sheets

METHOD TO MINIMIZE CD ETCH BIAS

CROSS REFERENCES TO RELATED APPLICATIONS

This application claims priority from and is related to commonly owned U.S. Provisional Patent Application Ser. No. 60/837,593 filed Aug. 11, 2006, entitled: Method to Minimize CD Etch Bias, this Provisional Patent Application incorporated by reference herein.

FIELD OF THE INVENTION

The invention relates to the fabrication of integrated circuits and to the fabrication of photomasks useful in the manufacture of integrated circuits.

BACKGROUND

It is known to add passivants to plasma etch chemistries to induce anisotropy. Typical passivants generate unsaturated radicals (e.g., $CF_x$, $CCl_x$, $CH_x$, etc.) in the plasma that oligomerize to form sidewall films that inhibit lateral etching. While previous examples are based on carbon based polymerizing chemistries; inorganic passivants have also been employed (e.g., Si containing, B containing, S containing, etc.).

Etchant-unsaturate (Etchant-passivant) strategies are used extensively in plasma processing. The etchant is typically a halogen and the unsaturate is typically carbon based in order to maintain an anisotropic etch, a balance must be achieved between the etchant and the passivant. If the balance is skewed by too much etchant, then the process becomes more isotropic inducing mask undercut which results in critical dimension (CD) loss. If the balance is skewed by too much passivant, then a passivation film may form on the surfaces to be etched, thereby stopping the etch.

In order to achieve a balance between the etch and passivation mechanisms, a third component may be added to the process gas mixture. In the case where the passivant is polymer based, an oxidant (e.g., oxygen containing compound) or reducer (e.g., hydrogen containing compound) may be added to the system. In this case, oxidant addition favors the etchant and reduces passivation efficiency while reducer (e.g., hydrogen) addition favors passivation formation. An example of this approach is the plasma etching of $SiO_2$ in fluorocarbon chemistries with the addition of hydrogen (for more passivation) or an oxidant (for less passivation).

In some cases it is disadvantageous to directly mix the passivant and etchant. By way of example, it is well known that Si etches isotropically in free fluorine. Adding unsaturated fluorocarbons to the process as a passivant to remain anisotropy consumes free fluorine resulting in reduced Si etch rates—furthermore, the free fluorine etchant also reduces the passivation efficiency. One solution to this limitation is time division multiplexed (TDM) etching. In this case the etchant and passivant are separated in time. The process is converted from a continuous etch process into a series of loops. Each loop typically consists of a passivation step to protect the etch sidewall, an anisotropic break through step to remove passivation from horizontal surfaces, and a main etch step; which is typically at least partially isotropic. The loops are then repeated in a cyclical fashion. For silicon etching, examples of this process are described in U.S. Pat. No. 5,501,893 and U.S. Pat. No. 4,985,114.

Dry etch processes are being more frequently used in the fabrication of photolithographic reticles 110. In the case of fabricating a binary chrome photomask, a pattern is defined into an etch mask 100 (e.g. photoresist which is typically by optical or electron beam lithography). A plasma etch process is then used to transfer the pattern of the etch mask 100 into the underlying film 105 (see FIG. 1). Ideally the CD of the initial etch mask 115 is replicated exactly into the final etch feature CD 125. Typically however, there is often a difference in the CD of the initial mask image 115 and the CD of the final etch pattern 125. This difference is typically referred to as the CD bias of the process 120. Plasma etching of chrome (Cr) containing films is typically performed in a $Cl_2/O_2$ based chemistry producing $CrO_2Cl_2$ (chromyl chloride) as a volatile by product. Typically, the oxygen composition of the process gas mixture is between approximately 5% and 30% resulting in a Cr etch that has some degree of anisotropy. The presence of oxygen in the process gas mixture tends to promote etching of organic materials such as photoresist. This etching of the resist is not entirely anisotropic and may result in some lateral etching of the patterned features resulting in a CD change. Higher oxygen concentrations tend to further reduce photoresist (PR:Cr) etch selectivity, and ultimately may induce undercutting of the Cr; both of these mechanisms tend to increase CD bias. Due to the presence of oxygen, plasma chrome etching has historically not been performed using a etchant-passivation strategy where the passivant is polymer based. Polymer addition in the presence of oxygen tends to consume the oxygen (e.g., forming CO, $CO_2$, $H_2O$, etc.) which compromises both the etch and passivation efficiency.

Some groups have attempted different passivation schemes for use in conjunction with a $Cl_2/O_2$ plasma based Cr etch processes. For example, it is known in the art to add $CO_x$, $SO_x$, and HCl in efforts to promote passivation and improve the Cr etch process.

Based on the limitations of the prior art, there is a need for an improved method of etching material from a photolithographic reticle in a manner that reduces process induced CD bias.

Nothing in the prior art provides the benefits attendant with the present invention.

Therefore, it is an object of the present invention to provide an improvement which overcomes the inadequacies of the prior art devices and which is a significant contribution to the advancement to the processing of photomasks and reticles.

Another object of the present invention is to provide a method for improving the critical dimension performance during a plasma etching process of a photolithographic substrate having a thin film, comprising: depositing a passivation film on said photolithographic substrate using a first set of process conditions; etching said deposited film from said photolithographic substrate using a second set of process conditions; etching an exposed surface of said photolithographic substrate using a third set of process conditions; and monitoring the critical dimension performance of said photolithographic substrate.

Yet another object of the present invention is to provide a method for improving the critical dimension performance during a plasma etching process of a photolithographic substrate having a thin film, comprising: predetermining the critical dimension performance of a deposition process; predetermining the critical dimension performance of a first etch process; predetermining the critical dimension performance of a second etch process; selecting a first set of process conditions based on said predetermined critical dimension performance of said deposition process step; depositing a passivation film on the photolithographic substrate using said first set of process conditions; selecting a second set of process conditions based on said predetermined critical dimension performance of said first etch process step; etching said deposited film from the photolithographic substrate using said second set of process conditions; selecting a third set of process conditions based on said predetermined critical dimension performance of said second etch process step; and etching an exposed surface of the photolithographic substrate using said third set of process conditions.

Still yet another object of the present invention is to provide a method for improving the critical dimension performance during a plasma etching process of a photolithographic substrate having a thin films comprising: depositing a passivation film on said photolithographic substrate using a first set of process conditions; etching said deposited film from said photolithographic substrate using a second set of process conditions: and etching an exposed surface of said photolithographic substrate using a third set of process conditions.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method that allows the critical dimensions of photolithographic substrate to be monitored and adjusted during plasma processing.

A feature of the present invention is to provide a method for improving the critical dimension performance during a plasma etching process of a photolithographic substrate having a thin film that can be at least partially transmissive to light and/or contain chromium. The photolithographic substrate can be placed on a support member in a vacuum chamber. The support member can be a stage that contacts the outer five millimeters of the photolithographic substrate. Or, the stage can contact the photolithographic substrate at three points. The method comprising the steps of depositing a passivation film on the photolithographic substrate using a first set of process conditions. It should be noted that the deposition step can be performed without utilizing plasma. Non-plasma based deposition methods (e.g., thermal decomposition, chemical vapor deposition, etc.) exist that would be suitable for this application. The passivation film may be carbon containing (e.g., polymer based or diamond like carbon (DLC)) or inorganic in nature (e.g., silicon containing, sulfur containing, etc.). In the case of a polymer film, the polymer may be formed using a hydrocarbon precursor (e g., $CH_4$, $C_2H_6$, $C_2H_2$, etc.) or the polymer precursor may be a halocarbon. The deposited film is etched from the photolithographic substrate using a second set of process conditions. An exposed surface of the photolithographic substrate is etched using a third set of process conditions. The etching of the exposed surface of the photolithographic substrate can be substantially anisotropic. The exposed surface of the photolithographic substrate can comprise the thin film and/or silicon. During the plasma processing of the photolithographic substrate, the critical dimension performance of the photolithographic substrate is monitored to insure that the target uniformity and feature widths are obtained by adjusting the deposition and etch plasma processing of the photolithographic substrate.

Another feature of the present invention is to provide a method for improving the critical dimension performance during a plasma etching process of a photolithographic substrate having a thin film that can be at least partially transmissive to light and/or contain chromium. The photolithographic substrate can be placed on a support member in a vacuum chamber. The support member can be a stage that contacts the outer five millimeters of the photolithographic substrate. Or, the stage can contact the photolithographic substrate at three points. The method comprising the steps of predetermining the critical dimension performance of a deposition process, predetermining the critical dimension performance of a first etch process and predetermining the critical dimension performance of a second etch process. A first set of process conditions are selected based on the predetermined critical dimension performance of the deposition process step. A passivation film is then deposited on the photolithographic substrate using the first set of process conditions. It should be noted that the deposition step can be performed without utilizing plasma. Non-plasma based deposition methods (e.g., thermal decomposition, chemical vapor deposition, etc.) exist that would be suitable for this application. The passivation film may be carbon containing (e.g., polymer based or diamond like carbon (DLC)) or inorganic in nature (e.g., silicon containing, sulfur containing, etc.). In the case of a polymer film, the polymer may be formed using a hydrocarbon precursor (e.g., $CH_4$, $C_2H_6$, $C_2H_2$, etc.) or the polymer precursor may be a halocarbon. A second set of process conditions are selected based on the predetermined critical dimension performance of the first etch process step. The deposited film is then etched from the photolithographic substrate using the second set of process conditions. A third set of process conditions are selected based on the predetermined critical dimension performance of the second etch process step. An exposed surface of the photolithographic substrate is etched using a third set of process conditions. The etching of the exposed surface of the photolithographic substrate can be substantially anisotropic. The exposed surface of the photolithographic substrate can comprise the thin film and/or silicon.

Yet another feature of the present invention is to provide a method for improving the critical dimension performance during a plasma etching process of a photolithographic substrate having a thin film that can be at least partially transmissive to light and/or contain chromium. The photolithographic substrate can be placed on a support member in a vacuum chamber. The support member can be a stage that contacts the outer five millimeters of the photolithographic substrate. Or, the stage can contact the photolithographic substrate at three points. The method comprising the steps of depositing a passivation film on the photolithographic substrate using a first set of process conditions. It should be noted that the deposition step can be performed without utilizing plasma. Non-plasma based deposition methods (e.g., thermal decomposition, chemical vapor deposition, etc.) exist that would be suitable for this application. The passivation film may be carbon containing (e.g., polymer based or diamond like carbon (DLC)) or inorganic in nature (e.g., silicon containing, sulfur containing, etc.). In the case of a polymer film, the polymer may be formed using a hydrocarbon precursor (e.g, $CH_4$, $C_2H_6$, $C_2H_2$, etc.) or the polymer precursor may be a halocarbon. The deposited film is etched from the photolithographic substrate using a second set of process conditions. An exposed surface of the photolithographic substrate is etched using a third set of process conditions. The etching of the exposed surface of the photolithographic substrate can be substantially anisotropic. The exposed surface of the photolithographic substrate can comprise the thin film and/or silicon.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

The present invention provides a method to minimize the CD etch bias during the plasma processing of a photolithographic substrate.

Adding a polymer passivant to a $Cl_2/O_2$ based chrome plasma etch process reduces the efficiency of both the etch and passivation mechanisms. Therefore in order to retain the passivation benefits (reduced CD loss) while maintaining the Cr etch efficiency, the passivation and etch steps are at least partially separated in time.

Figure 1:
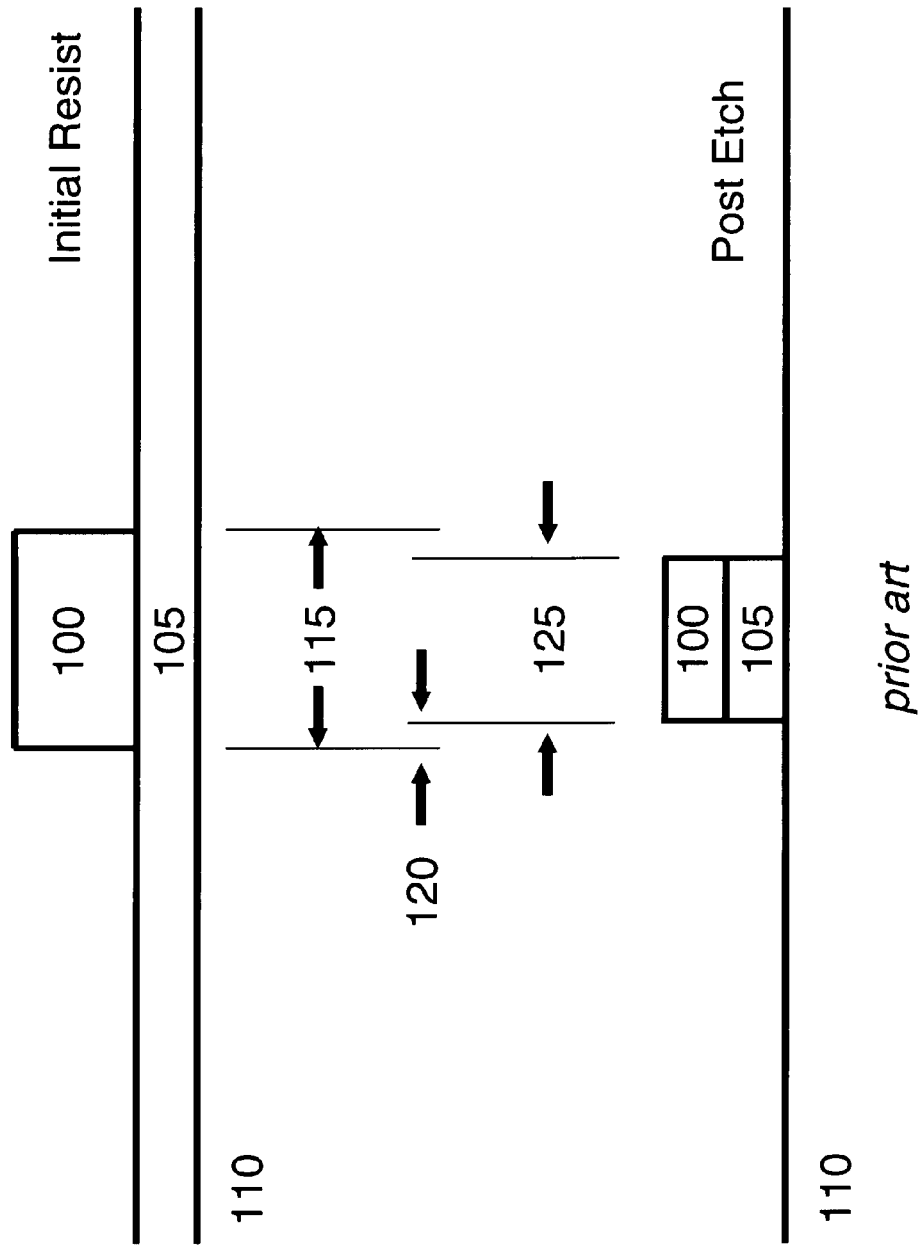
FIG. 1 is a schematic view of a prior art etch process showing the change in critical dimensions during plasma processing.
Figure 2:
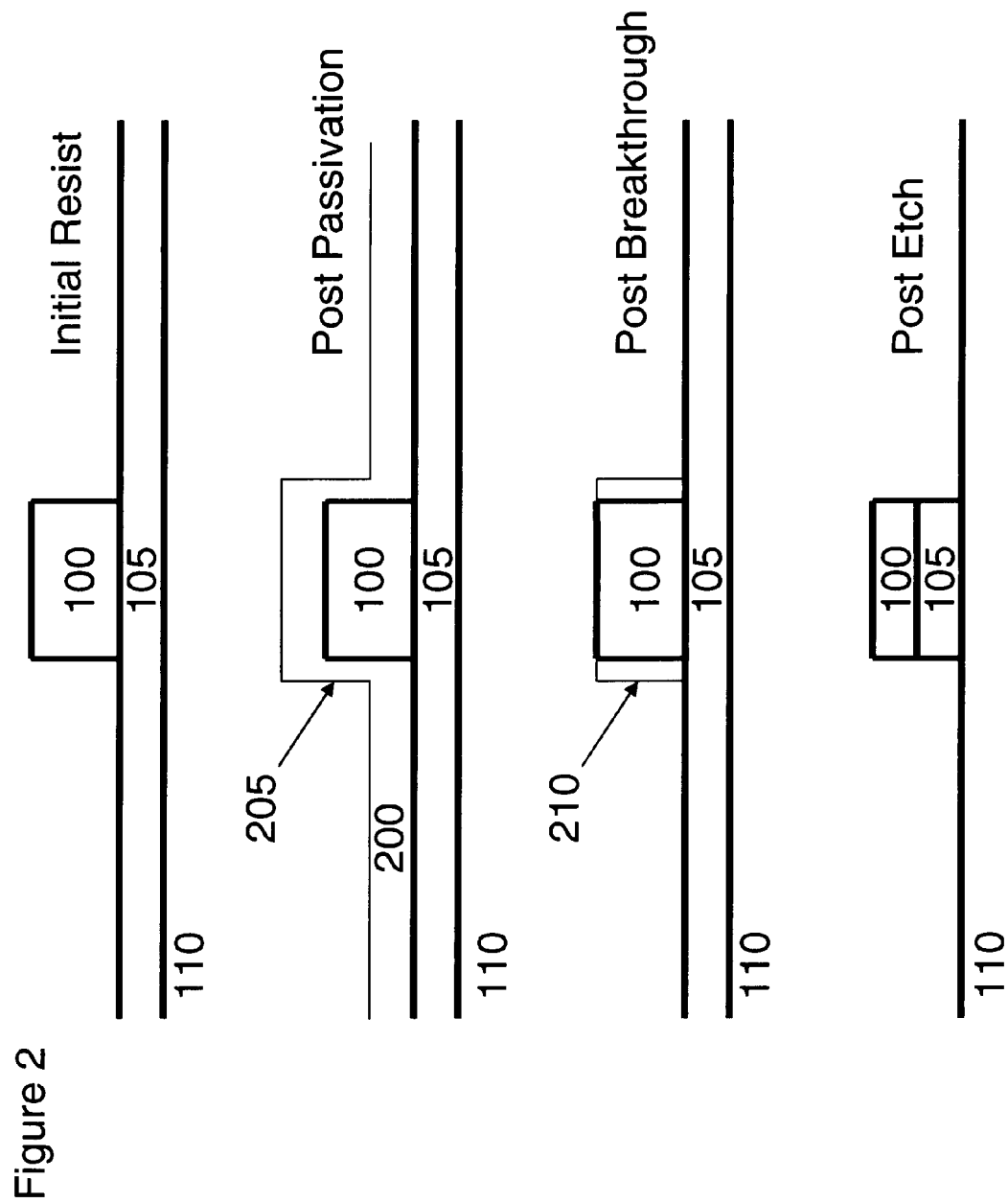
FIG. 2 is a schematic view of the etch process of the present invention maintaining the critical dimensions during plasma processing.
Figure 3:
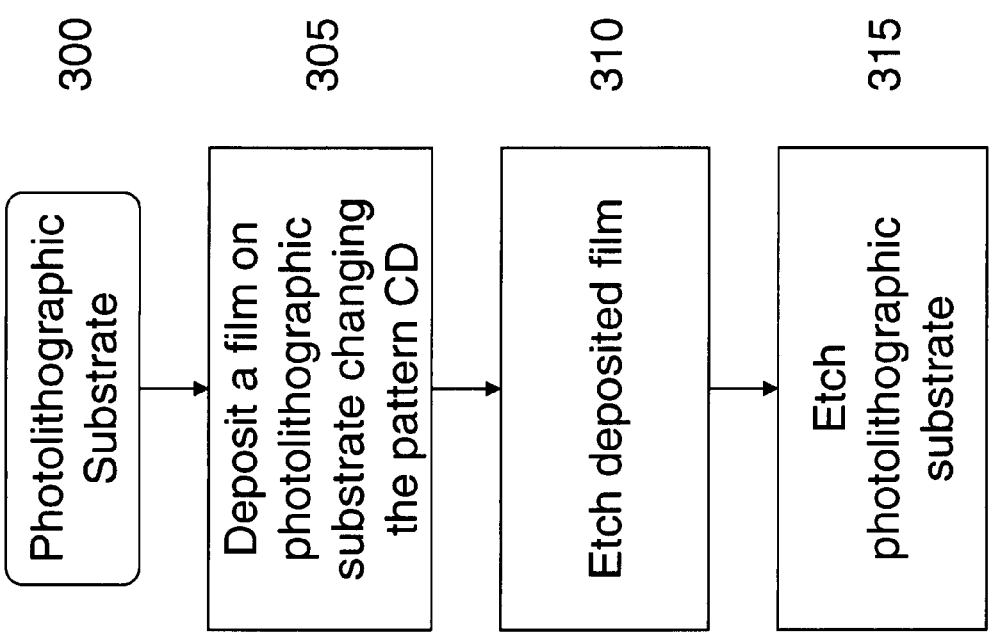
FIG. 3 is a block diagram of the process flow according to the present invention.

FIGS. 2 and 3 illustrate the invention. The process starts with a photolithographic reticle 110 that has a thin film 105 previously deposited on the reticle 300. An etch mask 110 has been previously patterned on the thin film 105. During the 1$^{st}$ step 305 of the improved process, a passivation film 200 is deposited on the reticle structure. The passivating film 200 adds to the CD of the as patterned etch mask (e.g., photoresist, chromium, etc.). The passivation applied to the patterned etch mask is used to compensate for the expected CD loss during the main etch process. For example, if a typical Cr plasma etch process causes 30 nm of CD bias (that is CD final Cr–CD etch mask=30 nm for a space or CD final Cr–CD etch mask=–30 nm for a line) then a passivating film that increases the etch mask CD by 30 nm may be applied prior to the etch process. In order to increase the CD of the etch mask, the passivation must be deposited on the etch mask sidewall 205 (vertical or non horizontal surfaces (in the case of a sloped etch mask)). The passivation film may also be present on horizontal surfaces.

It is important to note that while the example above suggests using the deposition process to compensate for CD bias induced by the main etch process, that it may be advantageous to modify the CD of the etch mask to a value other than that induced by the main etch process. For example, the deposition process can be used to adjust the mean to target (MTT) of the final etched features to a target value that is different from the initial etch mask CD.

The passivation film may be carbon containing (e.g., polymer based or diamond like carbon (DLC)) or inorganic in nature (e.g., silicon containing, sulfur containing, etc.). In the case of a polymer film, the polymer may be formed using a hydrocarbon precursor.

In a preferred embodiment, the hydrocarbon precursor is of the form $C_xH_y$. (e.g., $CH_4$, $C_2H_6$, $C_2H_2$, etc.). In another embodiment the polymer precursor may be a halocarbon.

Typically, the processes gases in a photolithographic etch process are introduced into the plasma source to enable more efficient ionization. In some cases, it may be advantageous to introduce gases nearly coplanar with the substrate.

In one embodiment, a portion of at least one process gas is introduced into the process chamber outside the plasma generation zone.

In a preferred embodiment, at least some volumetric flow of the process gas for the passivation step is introduced outside the plasma generation zone (e.g., high density plasma source).

In another preferred embodiment at least some portion of the process gas for the deposition process is introduced coplanar to the substrate surface.

In the case where passivation has been deposited on horizontal surfaces, a breakthrough step 310 is required where the passivation film is removed from the horizontal surfaces to once again expose the material to be etched. During the clearing of the horizontal surfaces—some passivation may also be removed from non-horizontal surfaces. Once the passivation film has been cleared from the horizontal surfaces, it is important that some passivation film 210 remain on at least some of the non-horizontal surfaces. The breakthrough step may use reactive gases (e.g., oxygen containing, hydrogen containing, halogen containing, etc.) or inert gases (e.g., Ar, He, $N_2$, etc.) or some combination of reactive & inert gases. The breakthrough step may be selective to underlying material to be etched, or the breakthrough step may be allowed to etch the underlying film or substrate.

It is believed that a deposition step may be constructed such that a passivation film is deposited on at least one non-horizontal surface while the horizontal surfaces are etched. In this case a breakthrough step may not be required.

In another embodiment, the material to be etched from the photolithographic reticle is partially etched prior to the passivation step to adjust the feature CD. As an example, a process may be constructed to process a binary chrome photolithographic reticle such that the antireflective (AR) chrome layer may be at least partially etched prior to applying a passivation film.

Once the horizontal surfaces have been cleared of passivation, the main etch step 315 of the process etches the thin film 105 (e.g., Cr, MoSi, phase shifting material, etc). The CD loss incurred by this etch step is at least partially offset by the CD gain of the initial passivation step. Furthermore, it is possible to construct an etch process that actually induces negative CD bias (e.g., The CD of a line (dark feature) is larger after the etch process than prior to the etch process).

In one embodiment the main etch step is at least partially anisotropic. In a preferred embodiment, the main etch step is substantially anisotropic.

Note that the process used in the breakthrough and main etch steps may be identical.

While the example above describes etching a thin film deposited on a photolithographic reticle, the procedure can be applied to a process that etches the reticle substrate as well.

In a separate embodiment, the main etch step may not etch the thin film to completion. In this case the passivation 305, breakthrough 310, and main etch 315 steps may be repeated in a cyclical manner.

In order to control the extent and uniformity of CD compensation, it may be necessary to first characterize the performance of the deposition of the passivating layer. In another embodiment, a photomask is first measured to determine the initial etch mask thickness and CD. Measurements may be taken over the entire quality area of the photomask in order to characterize uniformity of both CD and thickness.

The pre-measured photomask is then placed in the process chamber and a passivating layer is deposited using an initial process. The deposition process may be performed by means of a plasma. The photomask is then removed from the chamber and re-measured for both film thickness and feature CD in ideally the same locations as previously measured. Post-deposition measurements can be compared with the initial measurements to determine the contribution of the deposition process to film thickness and feature CD. Based on this data, subsequent deposition processes can then be modified to add or remove passivation. The deposited film could also be made substantially nonconformal to add or remove passivation from selected features in a way that depends on initial feature size or geometry. In this manner the feature CDs, CD uniformity, and/or CD linearity may be adjusted to a desired level.

After deposition, the photomask may be exposed to a breakthrough process in order to clear the passivation layer from the Cr layer in preparation for etching. It may be necessary to characterize the breakthrough process to obtain proper CD compensation (where CD compensation may be defined as absolute feature CD, feature CD uniformity, CD linearity, etc.). Following post-deposition measurement of the CD and resist thickness, the photomask is placed in a process chamber and exposed to a process that is at least partially anisotropic for removing the passivating layer. The photomask is then removed from the process chamber and may be re-measured for both film thickness and CD performance in ideally the same locations as previously measured. Post-breakthrough measurements may be compared with post-deposition measurements to determine the contribution of the breakthrough process to thickness and CD performance. Based on this data, subsequent breakthrough processes can be modified to remove more or less of the passivation layer and/or photoresist, as well as alter the uniformity of the remaining passivation layer and/or photoresist. In this manner either the feature CD or CD uniformity or both may be adjusted to a desired level.

Once the deposition and breakthrough processes have been characterized, it is possible to then modify either or both processes to achieve a desired CD shift induced by a given main etch process.

In a preferred embodiment, the desired CD shift induced by the passivation and break through processes exactly offsets the CD bias induced by the main etch such that the final Cr CD performance matches the initial mask CD performance.

In another embodiment, the CD shift induced by the passivation, break through and main etch steps is adjusted to match a target final Cr CD performance which does not necessarily match the initial mask CD performance.

In this embodiment, the deposition step of the composite etch process is constructed such that a desired final target CD performance is achieved (e.g., the deposition process adjusts the CD performance of the initial etch mask to a desired target CD performance taking into account the main etch and overetch CD performance).

One example of such a process flow is shown below, this process may be realized as follows:
  Identify the desired target CD performance
  Characterize the CD character of the initial etch mask
  Characterize or predict the CD performance of the main etch step
  Characterize or predict the CD performance of the overetch step
  Calculate a point-by-point difference to identify the required CD shift
    Required CD shift=Desired CD−Initial CD+etch CD shift
      Where etch CD shift=main etch shift+overetch shift
  Determine deposition process conditions that result in the required CD shift
  Construct a composite etch process utilizing
  The determined deposition process
  The deposition removal process (if required)
  The etch process
  The over etch process (if required)

Note that in the example above, it is assumed that there is no CD performance impact of the deposition removal process. In the case where the CD shift of the deposition removal process is not negligible then:
Required CD shift=Desired CD−Initial CD+passivation removal shift+etch shift In yet another embodiment, CD performance of the photolithographic reticle may be measured during the course of the process (e.g., using in-situ metrology). Nondestructive CD measurement tools (such as scatterometry-based systems like the Atlas system from Nanometrics or the n&k1700RT from n&k Technologies) could be integrated directly with the etch system for this purpose. This would allow the deposition step to be monitored and potentially modified during the course of the process in order to achieve the desired CD performance.

This would allow the deposition step to be modified during the course of the process in order to achieve the desired CD performance.

In yet another embodiment, the CD performance of the composite process may be monitored as the process proceeds. A deposition step or steps may be added to the composite process during the process to adjust the CD performance of the photolithographic reticle during the process.

EXAMPLES

Photolithographic reticles including a substrate made of fused silica with a typical chrome containing layer about 70 nm thick were used. The chrome containing layer also contained an antireflective layer about 25 nm thick. The chrome containing layer was masked using a chemically amplified resist (CAR) approximately 300 nm thick and patterned using methods well known in the art.

In order to pattern the chrome containing layer, the substrate was processed in a plasma etch tool such as the Mask Etcher V which is commercially available through Oerlikon USA, St. Petersburg, Fla., USA.

Example I

Figure 4:
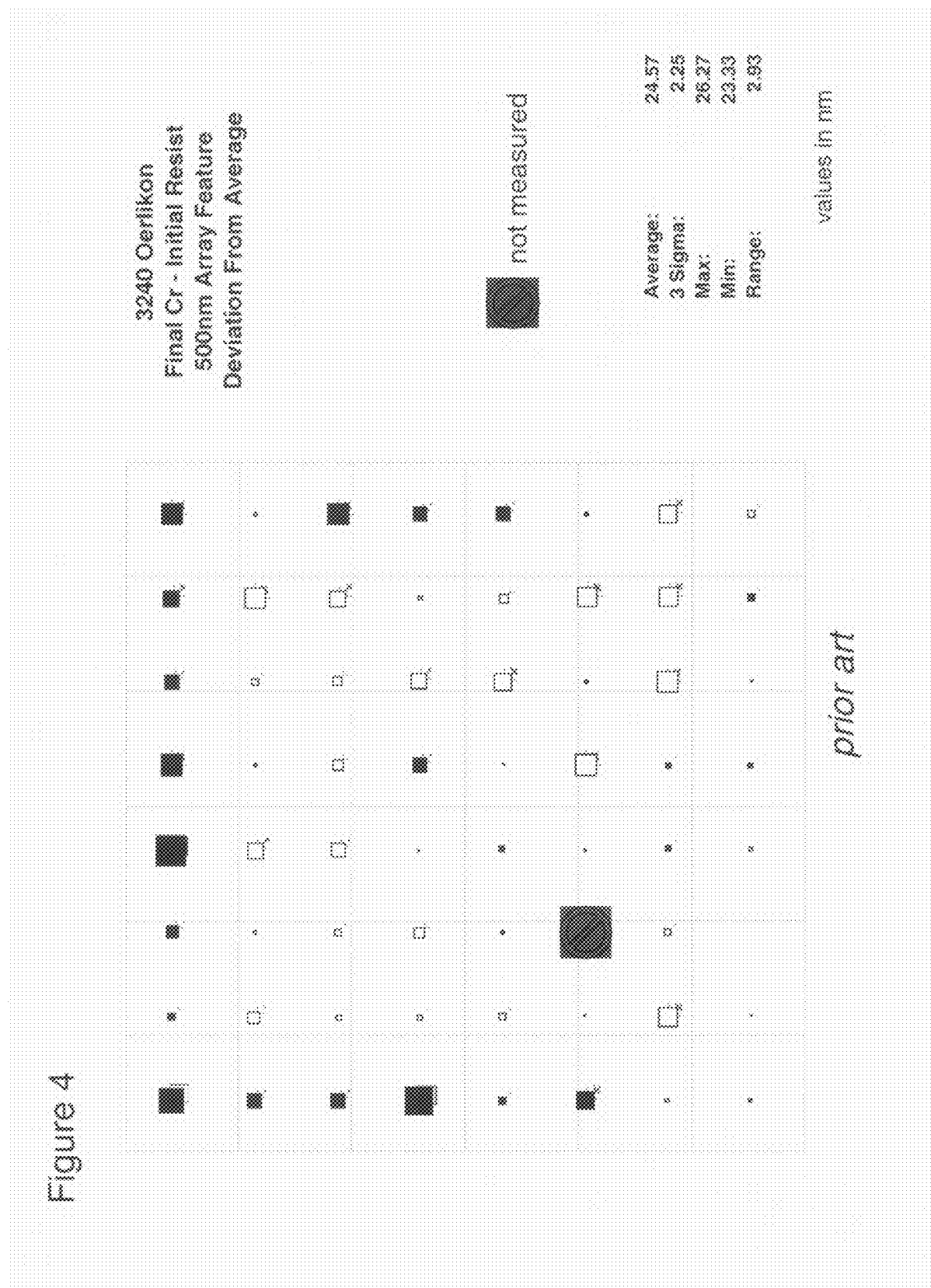
FIG. 4 shows a plot of the critical dimension performance of the 500 nm nominal clear features of the initial resist pattern using the prior art.

Isolated clear 500 nm features on "Clearwater" pattern low load photomask 3240, when exposed to a standard Cr etch process in an Oerlikon Gen 5 Mask Etcher (process conditions in Table 1), experienced a growth in CD of 25 nm and an etch contribution to uniformity of 2.3 nm, 3 s (see FIG. 4).

TABLE 1

| Process | Main Etch | Units |
|---|---|---|
| $Cl_2$ | 320 | Sccm |
| $O_2$ | 80 | Sccm |
| Pressure | 5 | Mtorr |
| RIE | 10 | W |
| Source 1 | 0 | W |
| Source 2 | 400 | W |
| Time | EP + 80% | Sec |
| Plate 3240 | | |

Based on this result, to compensate for the change in CD of the etch, it was desired to reduce the CD of the initial resist clear feature (space) by 25 nm.

A composite process consisting of a deposition process, a break through process, and main etch process (with overetch) was constructed to compensate for the 25 nm bias exhibited in the prior art process.

In the first step, a deposition process (deposition process conditions given in Table 2) was used to deposit a passivating layer of polymer on "Clearwater" pattern low load photomask 3301. The process had previously been optimized to deposit a uniform polymer layer, approximately 200 Å thick, on the top of the patterned resist. It has been previously determined that when the horizontal thickness of the polymer is approximately 200 Å, the initial CDs of the isolated clear 500 nm features were reduced by approximately 29 nm.

TABLE 2

| Process | Deposition | Breakthrough | Etch | Over etch | Units |
|---|---|---|---|---|---|
| $Cl_2$ | 0 | 100 | 320 | 320 | sccm |
| $O_2$ | 0 | 0 | 80 | 80 | sccm |
| $CH_4$ | 12 | 0 | 0 | 0 | sccm |
| Ar | 20 | 0 | 0 | 0 | sccm |
| Pressure | 2 | 2 | 5 | 5 | mtorr |
| RIE | 0 | 40 | 10 | 10 | W |
| Source 1 | 700 | 250 | 0 | 0 | W |
| Source 2 | n/a | 175 | 400 | 400 | W |
| Time | 150 | 48 | 241 EP + 80% | 193 | sec |
| Plate 3301 | | | | | |

In the second step, plate 3301 was exposed to a breakthrough step (breakthrough process conditions given in Table 2). The breakthrough process was optimized to uniformly remove about 250 Å of polymer from horizontal surfaces. In this example, removing 250 Å of polymer means that passivation layer plus about an additional 50 Å of photoresist was removed. Characterization of this process has shown that full exposure of the unmasked Cr surfaces was achieved with no discemable change in CD. In other words, there was no measurable shift in the post passivation feature CD due to the breakthrough process while clearing the passivation film from horizontal surfaces.

Figure 5:
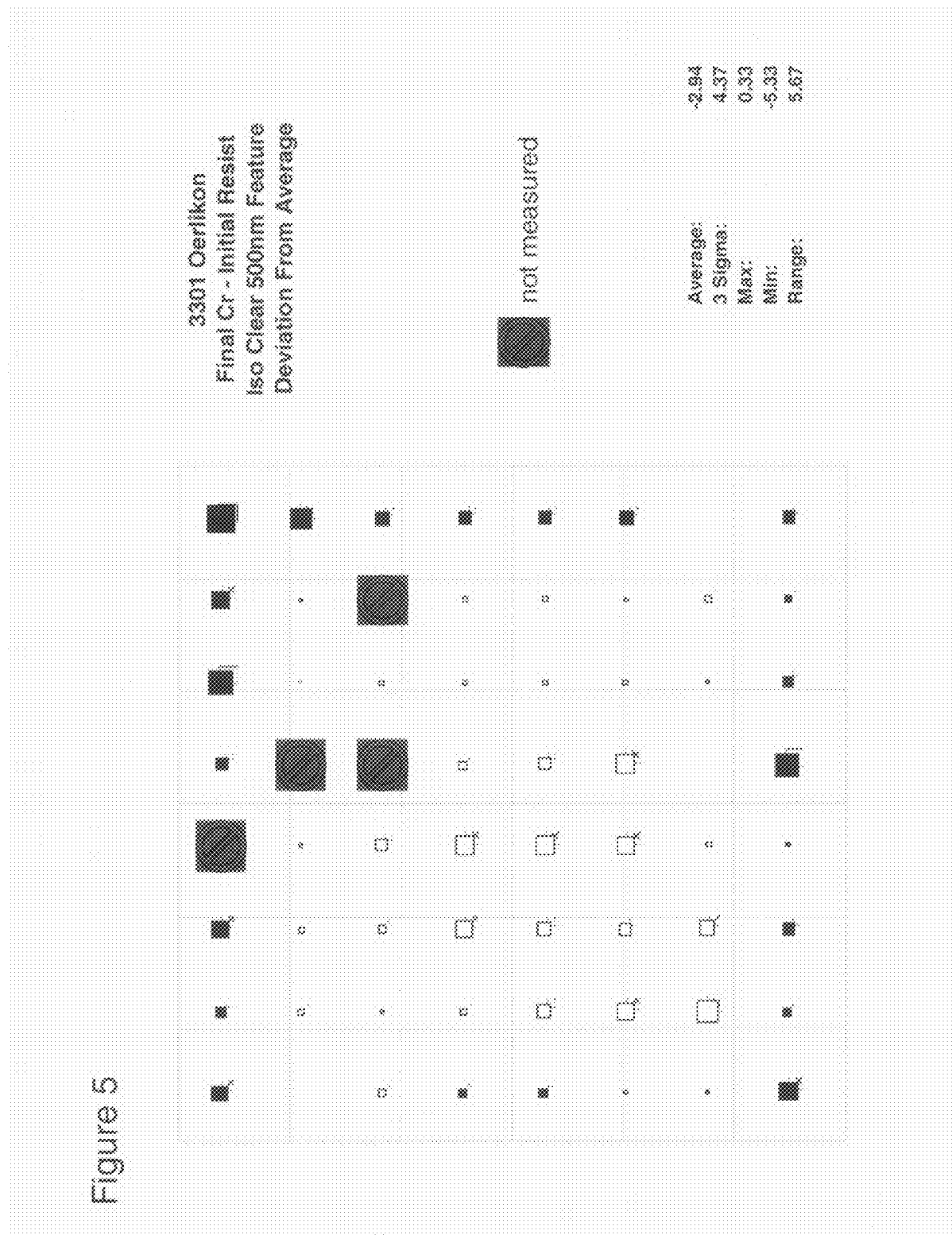
FIG. 5 shows a plot of the total process critical dimension performance using the present invention.

Finally, plate 3301 was exposed to a main etch step (main etch process conditions given in Table 2). After completing the etch process, the remaining resist was stripped in order to measure final Cr CD. FIG. 5 shows a plot of the total process CD performance (constructed by a point-by-point subtraction of the Final Cr CD from the Initial resist CD). The composite Cr etch process (deposition, break through and main etch) resulted in a composite CD bias of about −3 nm (that is to say that spaces with an initial CD of 500 nm were reduced to approximately 497 nm in the patterned Cr). This is in contrast to the results of plate 3240 (prior art) which exhibited a 25 nm CD bias (spaces with initial resist CD of 500 nm increased to approximately 525 nm in the patterned Cr).

Example II

A "Clearwater" pattern low load photomask 3282, was etched using a composite etch process using an Oerlikon Mask Etcher V. The composite etch process is shown in Table 3.

TABLE 3

| Process | Deposition | Breakthrough | Etch | Over etch | Units |
|---|---|---|---|---|---|
| $Cl_2$ | 0 | 0 | 320 | 320 | sccm |
| $O_2$ | 0 | 0 | 80 | 80 | sccm |
| $CH_4$ | 12 | 0 | 0 | 0 | sccm |
| Ar | 20 | 80 | 0 | 0 | sccm |
| Pressure | 1 | 3 | 5 | 5 | mtorr |
| RIE | 0 | 50 | 10 | 10 | W |
| Source 1 | 700 | 250 | 30 | 30 | W |
| Source 2 | n/a | n/a | 400 | 400 | W |
| Time | 180 | 70 | EP + 80% | | sec |
| Plate 3281 | | | | | |

Figure 6:
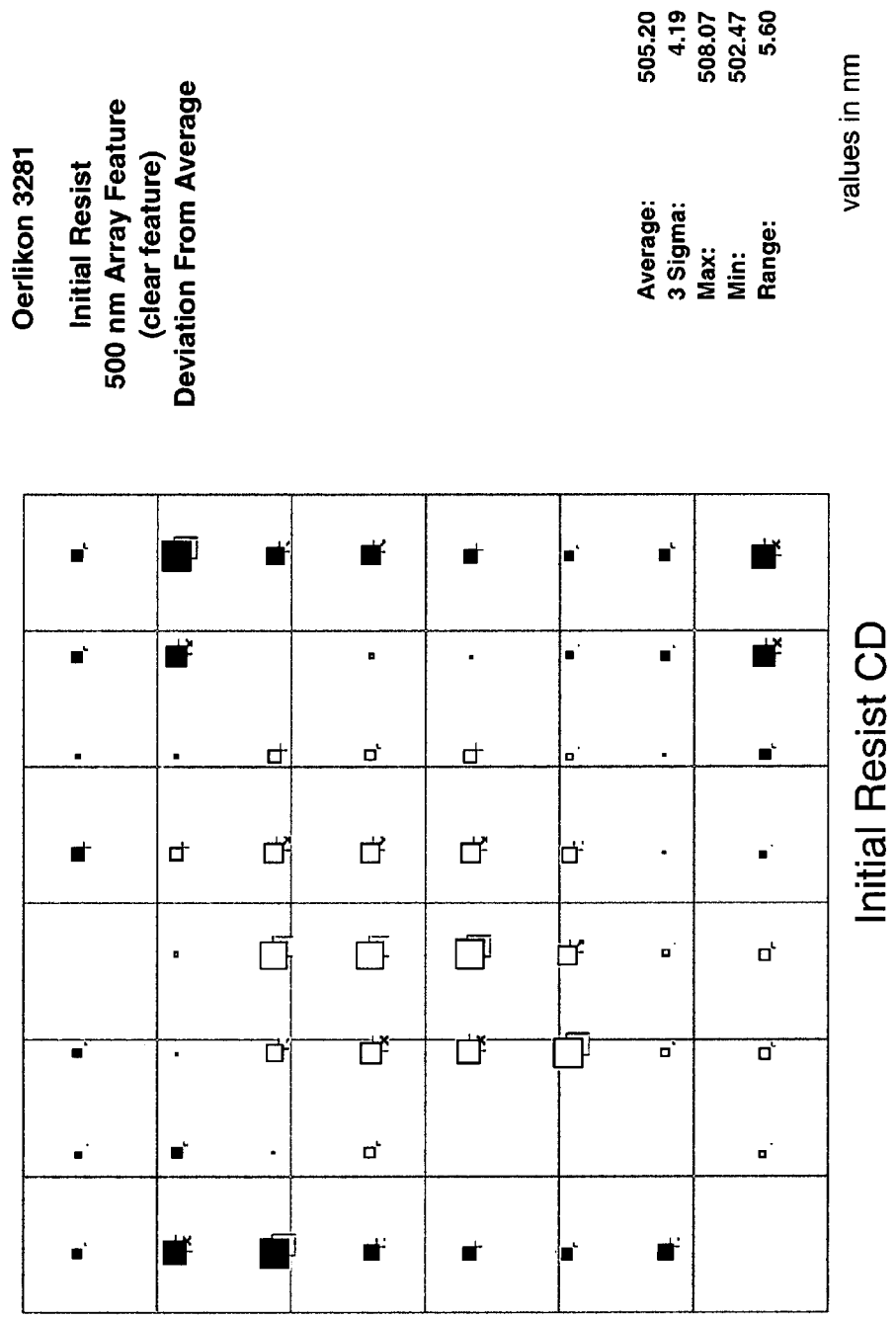
FIG. 6 shows a plot of the critical dimension performance of the 500 nm nominal clear features of the initial resist pattern using the present invention.

Prior to processing, the CD performance of the 500 nm nominal clear features (spaces) of the initial resist pattern were measured as shown in FIG. 6.

Figure 7:
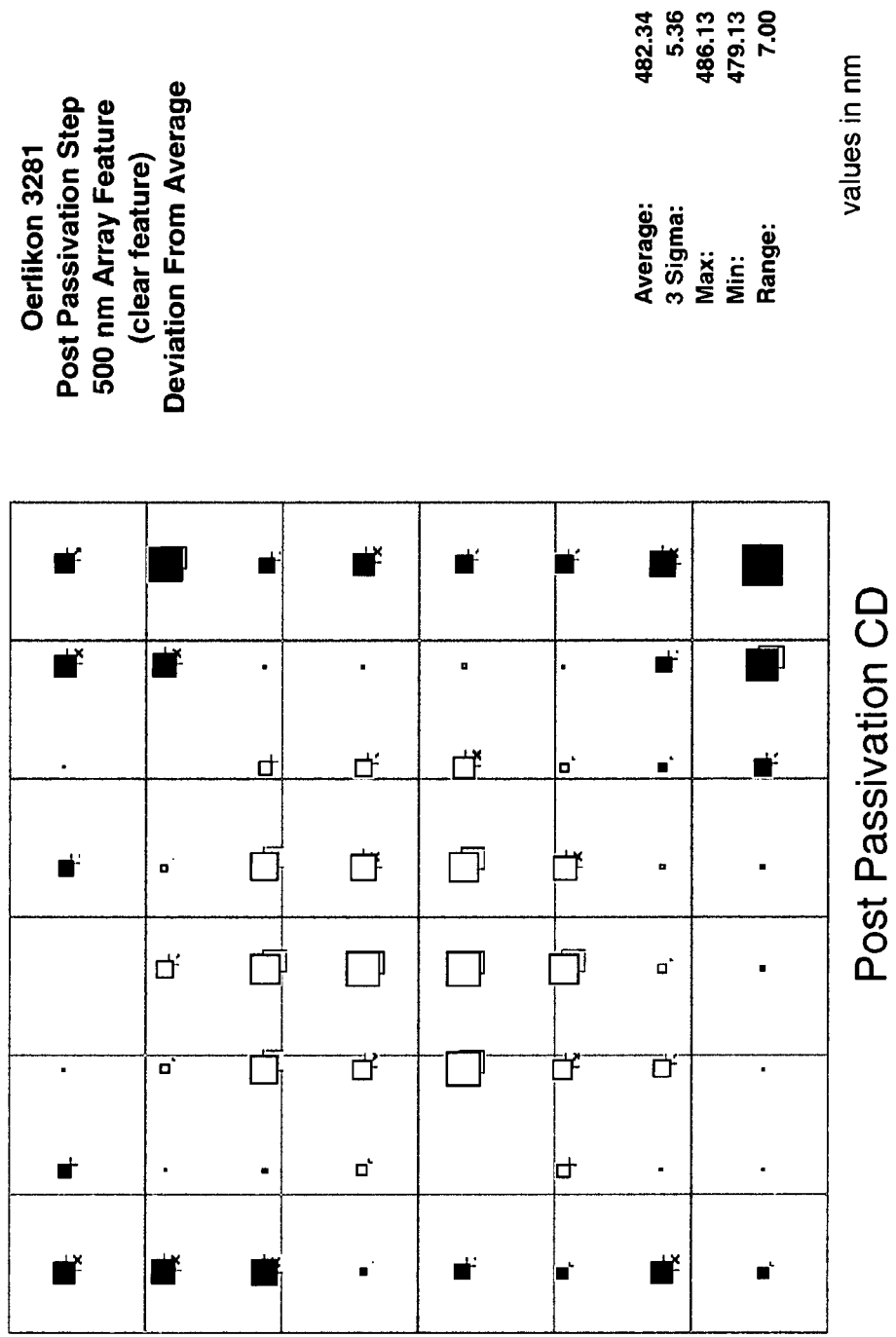
FIG. 7 shows a plot of the critical dimension performance of the 500 nm nominal clear features post passivation using the present invention.
Figure 8:
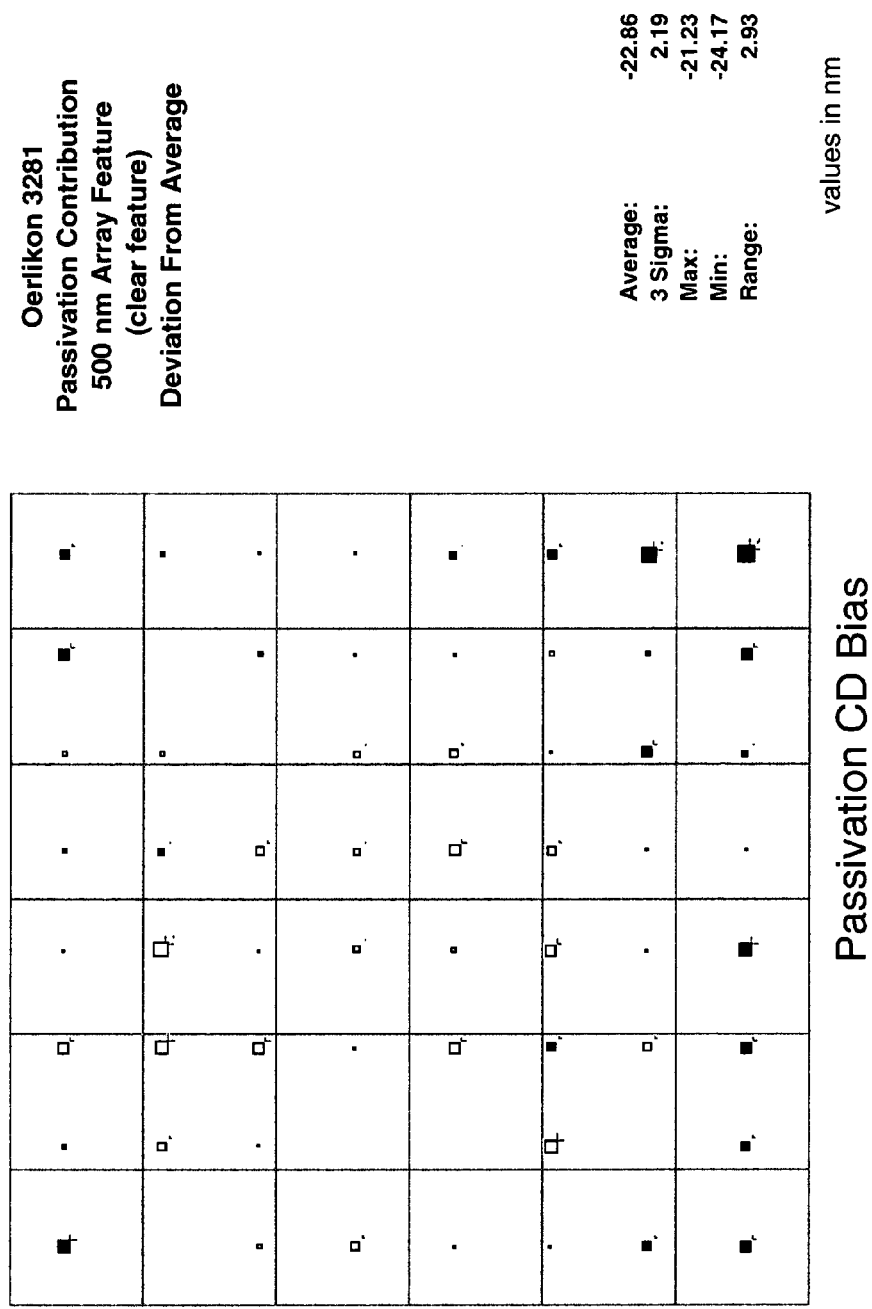
FIG. 8 shows a critical dimension difference plot constructed by a point-by-point subtraction using the present invention.

A passivation step based on a hydrocarbon chemistry (CH4 in this case) was performed using the conditions listed in Table 3. Post passivation CD measurements of the 500 nm nominal clear features are shown in FIG. 7. A difference plot constructed by a point-by-point subtraction is shown in FIG. 8. Note that the deposition decreased the 500 nm nominal space CD by approximately 23 nm.

Figure 9:
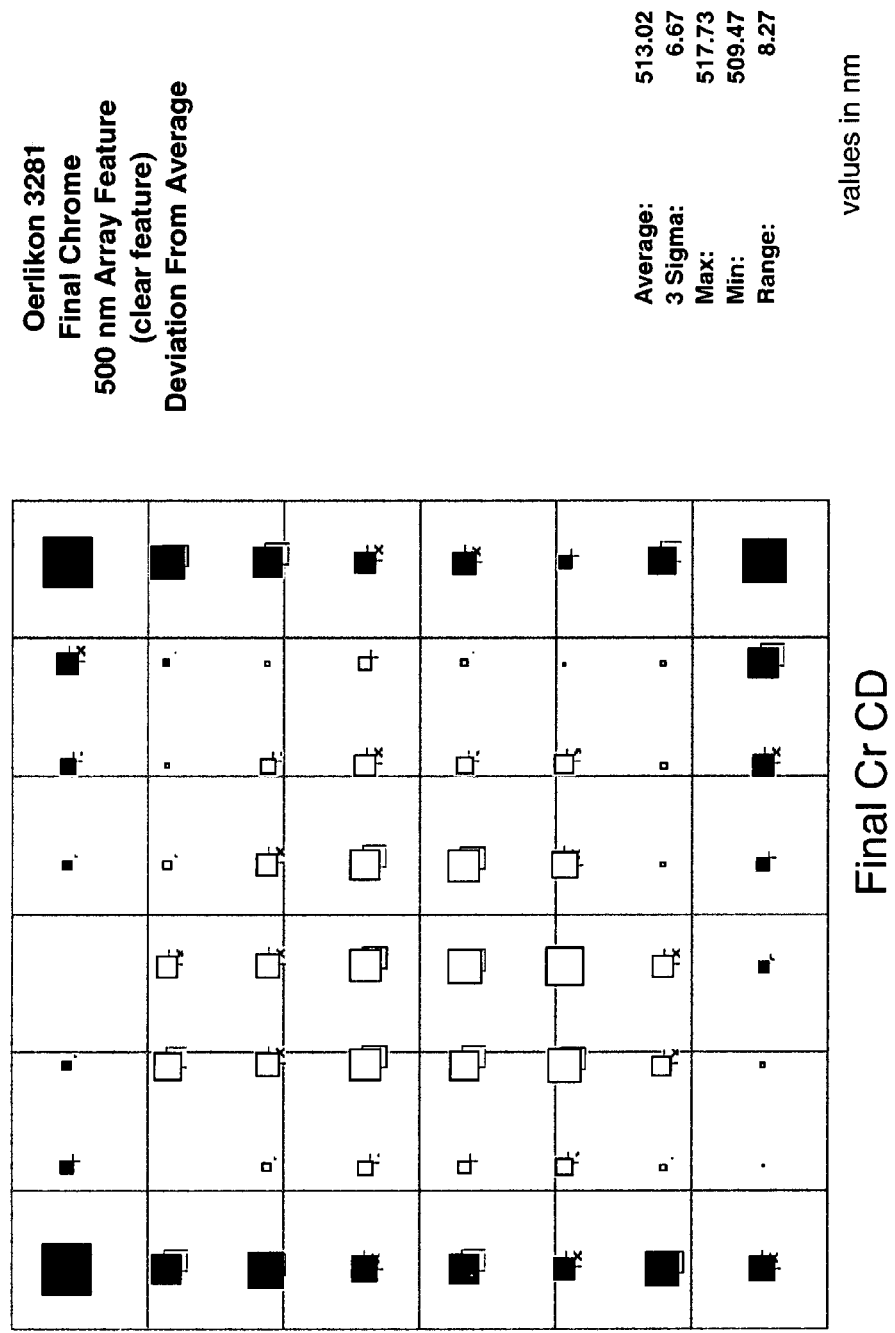
FIG. 9 shows a plot of the critical dimension performance of the 500 nm nominal clear features after the remaining resist was stripped using the present invention.
Figure 10:
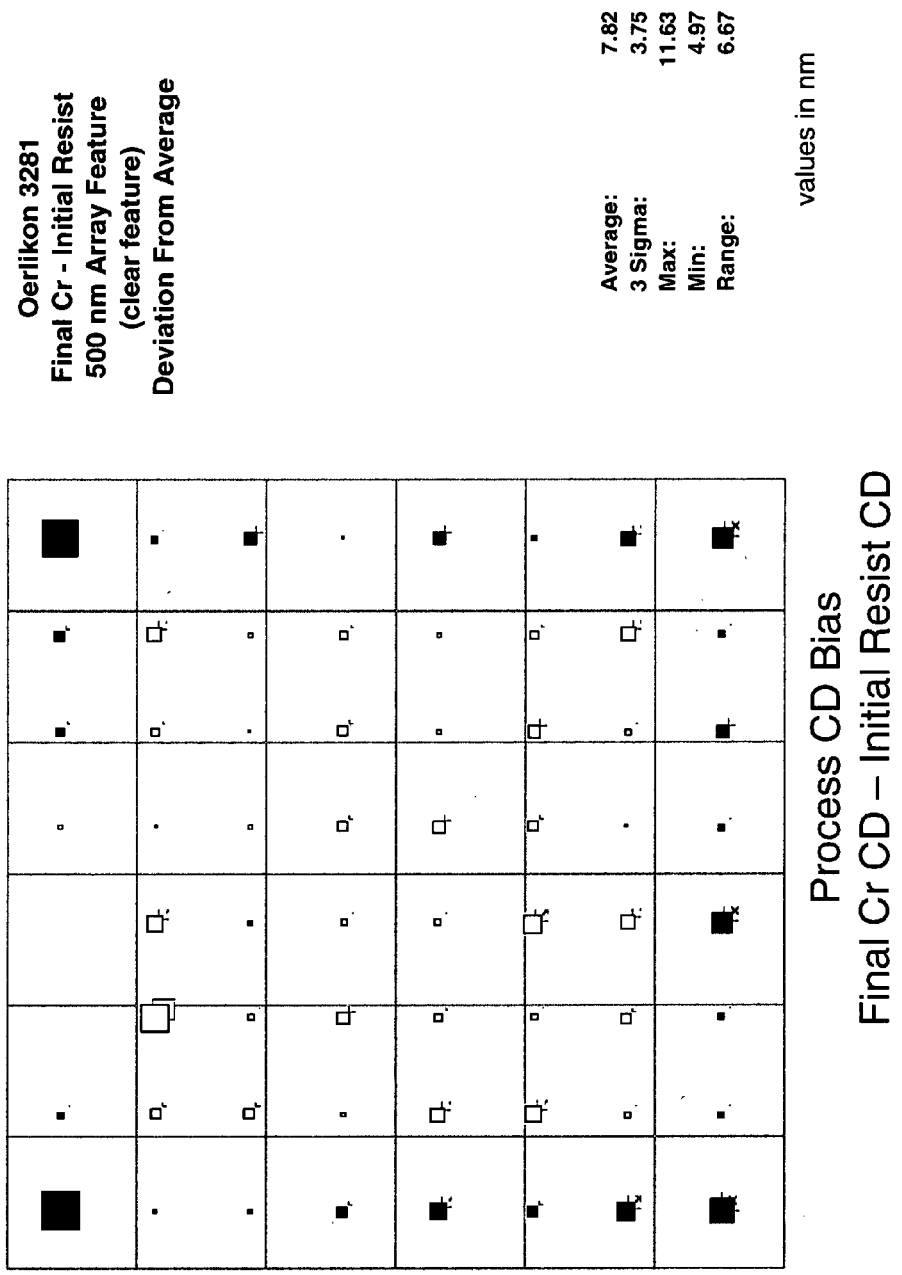
FIG. 10 shows a critical dimension difference plot constructed by a point-by-point subtraction between the final chrome measurements of FIG. 9 and the initial resist measurements of FIG. 6 using the present invention.

Following the post deposition measurement, the substrate was subjected to a break through step, main etch, and overetch using the conditions shown in Table 3. After etching, the remaining resist was stripped, and final chrome CD measurements were taken for the 500 nm nominal clear features (see FIG. 9). Finally, a CD difference plot (FIG. 10) was constructed using a point-by-point subtraction between the final chrome measurements (FIG. 9) and the initial resist measurements (FIG. 6).

The composite process resulted in a total process CD bias of approximately 8 nm as compared to the 25 nm CD bias of the prior art process.

Note while the examples above describes the invention as applied to defining a chrome containing film on a photolithographic substrate, the invention may be applied to etching a number of materials disposed on a photolithographic substrate, including the substrate material itself. The invention may also be applied to phase shifting photolithographic reticles. (e.g., MoSi, etc.). The invention may also be used for extreme ultraviolet mask materials such as Ta containing materials The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for improving a critical dimension performance during a plasma etching process of a photolithographic substrate, comprising:

providing a photomask comprising, in order, a photolithographic reticle having a thin film that has been previously deposited on said photolithographic reticle, an etch mask that has been previously patterned on said thin film;

placing said patterned etch mask on a support member in a vacuum chamber;

introducing a process gas into said vacuum chamber, at least some portion of the process gas is introduced coplanar to said patterned etch mask;

depositing a passivation film on non-horizontal surfaces and horizontal surfaces of said patterned etch mask using a first set of process conditions, said first set of process conditions including the use of said introduced process gas and said introduced portion of coplanar process gas;

clearing the deposited passivation film from the horizontal surfaces of said patterned etch mask using a second set of process conditions while some of the deposited passivation film remains on at least some of the non-horizontal surfaces of said patterned etch mask;

etching an exposed surface of the thin film using a third set of process conditions;

monitoring the critical dimension performance of said patterned etch mask using in-situ metrology; and adjusting the deposition step in-situ based on the monitoring step to achieve a desired critical dimension performance.

2. The method according to claim 1 wherein said passivation film is deposited non-conformally on said patterned etch mask.

3. The method according to claim 1 wherein said passivation film is formed from the group consisting of a carbon containing gas, a silicon containing gas and a sulfur containing gas.

4. The method according to claim 1 wherein said passivation film comprises a polymer based film.

5. The method according to claim 4 wherein said polymer based film is formed from a hydrocarbon containing gas.

6. The method according to claim 1 wherein said thin film is at least partially transmissive to light.

7. The method according to claim 1 wherein said thin film comprises chromium.

8. The method according to claim 1 wherein said thin film comprises silicon.

9. A method for improving a critical dimension performance during a plasma etching process of a photolithographic substrate, comprising:

providing a photomask comprising, in order, a photolithographic reticle having a thin film, that has been previously deposited on said photolithographic reticle, an etch mask that has been previously patterned on said thin film;

identifying a target critical dimension performance, said target critical dimension performance is less than an initial critical dimension performance of said patterned etch mask;

characterizing the critical dimension performance of a deposition process to achieve the target critical dimension performance;

characterizing the critical dimension performance of a first etch process to achieve the target critical dimension performance;

characterizing the critical dimension performance of a second etch process to achieve the target critical dimension performance;

selecting a first set of process conditions based on said characterized critical dimension performance of said deposition process step;

placing said patterned etch mask on a support member in a vacuum chamber;

introducing a process gas into said vacuum chamber, at least some portion of the process gas is introduced coplanar to said patterned etch mask;

depositing a passivation film on non-horizontal surfaces and horizontal surfaces of the patterned etch mask using said first set of process conditions, said first set of process conditions including the use of said introduced process gas and said introduced portion of coplanar process gas;

selecting a second set of process conditions based on said characterized critical dimension performance of said first etch process step;

clearing the deposited passivation film from the horizontal surfaces of the patterned etch mask using said second set of process conditions while some of the deposited passivation film remains on at least some of the non-horizontal surfaces of said patterned etch mask;

selecting a third set of process conditions based on said characterized critical dimension performance of said second etch process step; and etching an exposed surface of the thin film using said third set of process conditions.

10. The method according to claim 9 wherein said passivation film is deposited non-conformally on the patterned etch mask.

11. The method according to claim 9 wherein said passivation film is formed from the group consisting of a carbon containing gas, a silicon containing gas and a sulfur containing gas.

12. The method according to claim 9 wherein said passivation film comprises a polymer based film.

13. The method according to claim 12 wherein said polymer based film is formed from a hydrocarbon containing gas.

14. The method according to claim 9 wherein said thin film is at least partially transmissive to light.

15. The method according to claim 9 wherein said thin film comprises chromium.

16. The method according to claim 9 wherein said thin film comprises silicon.

* * * * *

UNITED STATES PATENT AND TRADEMARK OFFICE
CERTIFICATE OF CORRECTION

PATENT NO. : 8,187,483 B2
APPLICATION NO. : 11/834299
DATED : May 29, 2012
INVENTOR(S) : Jason Plumhoff et al.

It is certified that error appears in the above-identified patent and that said Letters Patent is hereby corrected as shown below:

Column 1, line 30 - delete "in" and add ". In"

Column 1, line 52 - delete "remain" and add "regain"

Column 3, line 11 - delete "films" and add "film"

Column 10, line 2 - delete "discemable" and add "discernable"

Column 10, line 22 - delete "3282" and add "3281"

Signed and Sealed this
Third Day of July, 2012

David J. Kappos
*Director of the United States Patent and Trademark Office*